(12) United States Patent  
Huijbregts et al.

(10) Patent No.: US 8,549,461 B2  
(45) Date of Patent: Oct. 1, 2013

(54) GENERATION OF INDEPENDENT LOGICAL AND PHYSICAL HIERARCHY

(75) Inventors: Eduard Petrus Huijbregts, Eindhoven (NL); Avijit Dey, Bangalore (IN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/314,253

(22) Filed: Dec. 8, 2011

(65) Prior Publication Data

US 2012/0151431 A1    Jun. 14, 2012

Related U.S. Application Data

(60) Provisional application No. 61/421,259, filed on Dec. 9, 2010.

(51) Int. Cl.
*G06F 17/50* (2006.01)

(52) U.S. Cl.
CPC ........ *G06F 17/5072* (2013.01); *G06F 17/5081* (2013.01); *G06F 17/505* (2013.01)
USPC ........... 716/129; 716/130; 716/131; 716/122; 716/123; 716/120; 703/16

(58) Field of Classification Search
CPC  G06F 17/5072; G06F 17/505; G06F 17/5081
USPC ................ 716/129, 130, 131, 122, 123, 124, 716/120; 703/16
See application file for complete search history.

(56) References Cited

U.S. PATENT DOCUMENTS

| | | | |
|---|---|---|---|
| 6,182,272 B1 * | 1/2001 | Andreev et al. | 716/129 |
| 6,529,913 B1 * | 3/2003 | Doig et al. | 707/999.101 |
| 6,886,140 B2 * | 4/2005 | Regnier | 716/103 |
| 7,117,473 B1 | 10/2006 | Knol et al. | |
| 7,720,664 B2 * | 5/2010 | Takaba et al. | 703/15 |
| 2002/0059553 A1 | 5/2002 | Eng | |
| 2003/0079190 A1 * | 4/2003 | Parashkevov et al. | 716/4 |
| 2003/0237070 A1 * | 12/2003 | Tomita et al. | 716/12 |
| 2005/0198605 A1 | 9/2005 | Knol et al. | |
| 2005/0204315 A1 * | 9/2005 | Knol et al. | 716/2 |
| 2006/0053396 A1 | 3/2006 | Eng | |
| 2007/0245281 A1 * | 10/2007 | Riepe et al. | 716/9 |
| 2008/0209383 A1 * | 8/2008 | Mayer | 716/13 |
| 2009/0030666 A1 * | 1/2009 | Van Huben et al. | 703/16 |

FOREIGN PATENT DOCUMENTS

| | | | |
|---|---|---|---|
| JP | 2005063275 A | * | 3/2005 |
| JP | 2006024053 A | * | 1/2006 |
| JP | 2011232920 A | * | 11/2011 |

* cited by examiner

*Primary Examiner* — Phallaka Kik
(74) *Attorney, Agent, or Firm* — Adams Intellex, PLC (57) ABSTRACT

A logically hierarchical netlist may be split along physical partition boundaries while retaining information on the logical hierarchy. Nets can be driven to higher levels of hierarchy in order to maintain connectivity and enable the original logical function. A mapping of nets can be created. During the design process merging of physical partitions may result in a new logically hierarchical netlist which retains the hierarchy of the original logically hierarchical netlist. The lowest common hierarchical ancestor (LCA) is identified and then the appropriate cells and nets are included during the merging process.

31 Claims, 10 Drawing Sheets

GENERATION OF INDEPENDENT LOGICAL AND PHYSICAL HIERARCHY

RELATED APPLICATIONS

This application claims the benefit of the U.S. provisional patent application "Generation of Independent Logical and Physical Hierarchy" Ser. No. 61/421,259, filed Dec. 9, 2010. The foregoing application is hereby incorporated by reference in its entirety.

FIELD OF INVENTION

This application relates generally to circuit design and more particularly to the generation of independent logical and physical hierarchy for on-chip circuitry.

BACKGROUND

Integrated circuit design is a vastly complex effort. Frequently, millions and even hundreds of millions of transistors can exist on a single semiconductor chip. The ability to design chips with this many transistors can be quite challenging and optimizing the circuitry as needed can be a daunting task even with the help of electronic design automation (EDA) software tools.

Hierarchy within a chip can be used to enable design of a portion of a chip and then to design interconnections between the various portions. Leaf cells can be the lowest level of logic, such as AND, OR, NAND, NOR, XOR, and XNOR gates. These types of gates are combinational logic where the output is a function of the inputs at any given time. Leaf cells can also include flip flops which are memory elements. These flip flops and other memory components make up sequential logic. The output of sequential logic is a function of the current inputs and what has occurred to that sequential logic over a period of time.

Logical hierarchy can represent different logical functions of a chip which can in turn be combined at higher levels of hierarchy. Physical hierarchy can represent different geographical regions of a chip. A single logical function can be spread across multiple geographical locations on a semiconductor chip.

SUMMARY

Manipulating logical hierarchies and physical partitions is crucial to be able to design complex and large semiconductor chips. A computer implemented method is disclosed for circuit design comprising: importing a logically hierarchical netlist and physical partitions; splitting the logically hierarchical netlist according to the physical partitions; retaining information on logical hierarchy within the physical partitions; driving nets that cross physical partition boundaries to a higher level of hierarchy and maintaining electrical connections for nets to match that of the logically hierarchical netlist which was imported; and providing a resulting netlist with nets which were driven to the higher level of hierarchy. The method may further comprise: obtaining new physical partitions wherein leaf cells are located differently from the physical partitions which were imported; merging incrementally the logically hierarchical netlist which was split to create a re-merged logically hierarchical netlist with the leaf cells which were located differently; and re-splitting incrementally the re-merged logically hierarchical netlist according to the new physical partitions. The new physical partitions may have connections between the leaf cells that have changed and wherein global routing topology of connections has changed, from the physical partitions which were imported. The method may further comprise: importing an updated logically hierarchical netlist; identifying differences between the logically hierarchical netlist which was originally imported and the updated logically hierarchical netlist; and modifying a plurality of leaf cells and connectivity within the physical partitions based on the differences which were identified. The modifying may include one of adding one or more new leaf cells, deleting one or more leaf cells, and modifying a connection between leaf cells. The splitting may accommodate multiple voltage domains while preserving logical connections between leaf cells. A placement region for the multiple voltage domains may be apportioned into a set of equivalent sub-regions wherein each sub-region belongs to one of the multiple voltage domains. The set of equivalent sub-regions may comprise the placement region originally used. The method may further comprise retaining information, from the logically hierarchical netlist which was imported, in the resulting netlist for each of the physical partitions, after the splitting. The method may further comprise flattening the logical hierarchy.

In embodiments, the retaining may be accomplished by performing a force maintain operation. The splitting may further comprise: creating an overlay cell at a lowest common hierarchical ancestor of one of the physical partitions; copying all cells and nets from logical hierarchy under the lowest common hierarchical ancestor; deleting all local nets that are not part of the one of the physical partitions; deleting all cells that are not part of the one of the physical partitions; creating a mapping of nets in the logical hierarchy and the physical partitions; assigning all local nets into the one of the physical partitions; and assigning wires under the one of the physical partitions based on physical overlap in the physical partitions. The splitting may further comprise transforming timing constraints for the logically hierarchical netlist so that timing requirements are maintained with the resulting netlist. The placement of leaf cells may be maintained after the splitting. The method may further comprise creating an index table describing the logically hierarchical netlist. The method may further comprise populating the index table with information from the logically hierarchical netlist which was imported.

In some embodiments, the method may further comprise merging the physical partitions to create a logical hierarchy. The merging may comprise: identifying original cells within a physical partition which were present at the splitting which occurred last; identifying new cells within the physical partition which have been added since the splitting which occurred last; including the original cells which were identified in hierarchical levels equivalent to those where the original cells belonged before the splitting; and including nets which connect the original cells within the physical partition. The method may further comprise: dividing the new cells, which were identified, into a plurality of sets wherein the new cells within one set are only connected to original cells and the new cells within the one set; and including the new cells in the one set in a single hierarchical level. The single hierarchical level may be a highest level of hierarchy for an original cell which is connected to a cell from the new cells in the one set. The logical hierarchy which was created may be an equivalent to that of the logically hierarchical netlist that was imported. The logical hierarchy which was created may be identical to that of the logically hierarchical netlist which was imported. The merging may further comprise: finding a lowest common hierarchical ancestor model of connected cells, based on the logically hierarchical netlist which was imported; including the connected cells in the lowest common hierarchical ancestor model; copying nets which interconnect the connected cells; reusing nets created by the splitting to stitch interface connections; and merging nets which connect different physical partitions. The method may further comprise writing an output. The output may be in a format from a group comprising Verilog, SDF, SPEF, and DEF.

In embodiments, a computer program product embodied in a non-transitory computer readable medium that, when executed, may performs steps of: importing a logically hierarchical netlist and physical partitions; splitting the logically hierarchical netlist according to the physical partitions; retaining information on logical hierarchy within the physical partitions; driving nets that cross physical partition boundaries to a higher level of hierarchy and maintaining electrical connections for nets to match that of the logically hierarchical netlist which was imported; and providing a resulting netlist with nets which were driven to the higher level of hierarchy. In some embodiments, a computer system for circuit design may comprise: a memory for storing instructions; one or more processors attached to the memory wherein the one or more processors are configured to: import a logically hierarchical netlist and physical partitions; split the logically hierarchical netlist according to the physical partitions; retain information on logical hierarchy within the physical partitions; drive nets that cross physical partition boundaries to a higher level of hierarchy and maintaining electrical connections for nets to match that of the logically hierarchical netlist which was imported; and provide a resulting netlist with nets which were driven to the higher level of hierarchy.

Various features, aspects, and advantages of numerous embodiments will become more apparent from the following description.

BRIEF DESCRIPTION OF THE DRAWINGS

The following detailed description of certain embodiments may be understood by reference to the following figures wherein.

DETAILED DESCRIPTION

The present disclosure provides a description of various apparatus, methods, and systems associated with the splitting and merging of logical and physical hierarchies within semiconductor on-chip circuitry. The use of logical hierarchy allows design in manageable sections where the portions of the design are related to one another. The use of physical partitions allows the design of sections which are near each other on a semiconductor chip. By being able to transition from a logically hierarchical to physical partitions and back again, design effort can be optimized and a better overall design can be achieved. A logically hierarchical netlist can be modified so that the netlist reflects those portions of a semiconductor chip which are in close proximity by a process called splitting. A netlist which has been split can be merged to obtain a logical netlist which is close to or even identical to the logically hierarchical netlist from which the design started.

Figure 1:
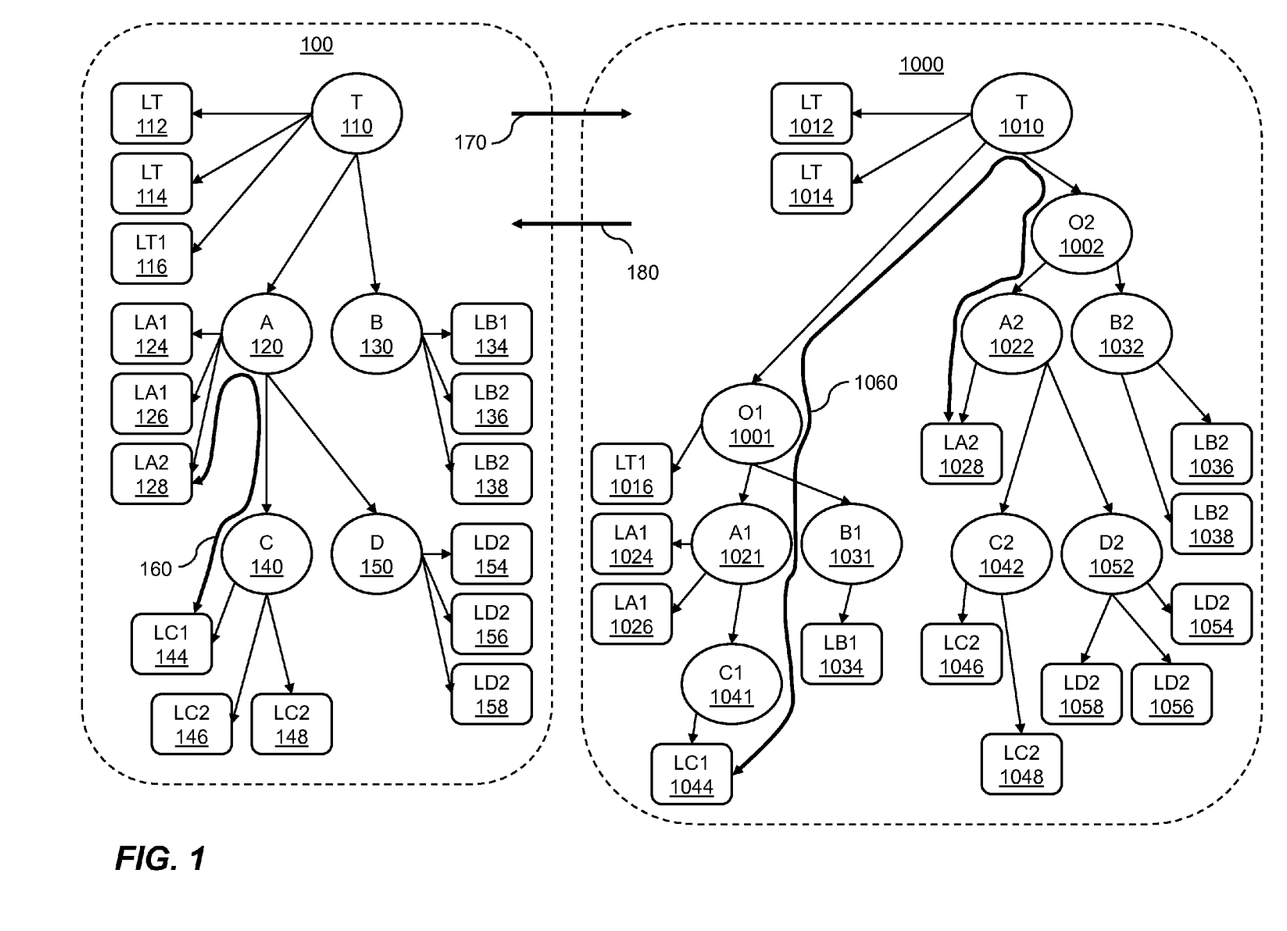
FIG. 1 is a diagram showing logical hierarchy netlist changes.

FIG. 1 is a diagram showing logical hierarchy netlist changes. FIG. 1 includes a logically hierarchical design 100 and a physically partitioned design 1000. The logically hierarchical design 100 and the physically partitioned design 1000 are provided for example purposes to illustrate the manipulations which are possible within the design. The manipulations include "splitting" and "merging" which will be described in more detail later. The physically partitioned design is a netlist, just as the logical hierarchy design is. The physically partitioned design, however, has separate hierarchy within the netlist to describe the models and leaf cells within each physical partition. The logically hierarchical design 100 has a top model "T" 110 within which are instantiated models "A" 120 and "B" 130. Model "A" 120 further has instantiated models of "C" 140 and "D" 150. The top model "T" 110 further includes leaf cells "LT" 112 and "LT" 114, and "LT1" 116. A leaf cell can be the lowest level of logic, such as for example AND, OR, NAND, NOR, XOR, XNOR, inverter, buffer, flip flop, or other gate. The various leaf cells may be connected within a model in order to accomplish a specific logical function. For instance, an XOR and an AND gate may be leaf cells in one model where the model provides a half-adder function. Likewise, a group of XOR, OR, and AND leaf cell gates may be combined in a model that provides a full-adder function. A higher level model may instantiate multiple instances of these half adders and full adders to accomplish a multiplier function. These combinations of leaf cells and models are provided by way of example to illustrate possible hierarchies and instantiations. Numerous other combinations and functions will be evident to one of skill in the art of logic design.

The leaf cells "LT" 112 and "LT" 114, and "LT1" 116 are instantiated at the top level within the logically hierarchical design. For explanation purposes, a concatenation of a "1", such as in the leaf cell "LT1", denotes that cell is in a physical partition which is the first physical partition or physical partition number "1". Likewise a concatenation of a "2" denotes that cell is in a physical partition which is the second physical partition or physical partition number "2".

Most leaf cells will be instantiated at lower levels of the logically hierarchical design. For instance model "A" 120 has leaf cells "LA1" 124, "LA1" 126, and "LA2" 128 instantiated. Likewise model "B" 130 has leaf cells "LB1" 134, "LB2" 136, and "LB2" 138 instantiated. Within model "C" 140 leaf cells "LC1" 144, "LC2" 146, and "LC2" 148 are instantiated. Within model "D" 150 leaf cells "LD2" 154, "LD2" 156, and "LD2" 158 are instantiated. A net 160 is shown connecting leaf cells "LA2" 128 and "LC1" 144. In order to connect "LA2" 128 with "LC1" 144, the net 160 must be connected through models "A" 120 and "C" 140.

The logically hierarchical design 100 may be split 170 based on layout regions into a new physically partitioned design 1000. A first physical and a second physical partition are provided in this example along with a top level model "T" 1010. The top level model "T" 1010 still has leaf cells "LT" 1012 and "LT" 1014 instantiated within the top level model "T" 1010. These two leaf cells correspond to "LT" 112 and "LT" 114 in the logically hierarchical design. After the splitting 170, new overlay models "O1" 1001 and "O2" 1002 are generated corresponding to the first and second physical partitions respectively. Since leaf cell "LT1" 1016 is part of the first physical partition, this leaf cell "LT1" 1016, which corresponds to "LT1" 116, is instantiated in the overlay model "O1" 1001. A copy of model "A" is instantiated within overlay model "O1" 1001 as model "A1" 1021. A copy of model "B" is also instantiated within overlay model "O1" 1001 as model "B1" 1031. When each copy of a model is included, such as the copy of model "A" as model "A1" 1021, any needed correction of interconnects is automatically included. These interconnect corrections may include modifications of I/O listings in the model or sub-models as well as propagation of needed interconnections up through the hierarchy.

Within model "A1" 1021, a copy of model "C" as model "C1" 1041 is instantiated. Within model "C1" 1041, leaf cell "LC1" 1044, which corresponds to "LC1" 144, is instantiated. Also within model "A1" 1021, leaf cells "LA1" 1024 and "LA1" 1026 are instantiated. Likewise, within model "B1" 1031, leaf cell "LB1" 1034, which corresponds to "LB1" 134, is instantiated.

For the second physical partition an overlay model "O2" 1002 is instantiated within the top level model "T" 1010. The overlay model "O2" includes instantiations of copies of the "A" and "B" models, being "A2" 1022 and "B2" 1032, respectively. Within "A2" 1022, leaf cell "LA2" 1028 is instantiated. Also with "A2" 1022, copies of the "C" and "D" models are instantiated as "C2" 1042 and "D2" 1052. Within model "C2" is instantiated leaf cells "LC2" 1046 and "LC2" 1048. Within model "D2" 1052 is instantiated leaf cells "LD2" 1054, "LD2" 1056, and "LD2" 1058. Within model "B2" 1032, leaf cells "LB2" 1036 and "LB2" 1038 are instantiated.

As stated earlier, the interconnections between the various models and cells in the logically hierarchical design 100 are implemented in the physically partitioned design 1000. Thus net 160 between leaf cells "LA2" 128 and "LC1" 144 in the logically hierarchical design is implemented between cells "LC1" 1044 and "LA2" 1028 at net 1060. Because "LC1" 1044 is part of the first physical partition and "LA2" 1028 is part of the second physical partition the net 1060 must be driven through the various new levels of hierarchy between the physical partitions. Thus net 1060 in the physically partitioned design 1000 traverses from leaf cell "LC1" 1044 through models "C1" 1041, "A1" 1021, "O1" 1001, "T" 1010, "O2" 1002, "A2" 1022 to "LA2" 1028. A process of merging 180 may recover a logically hierarchical netlist. Merging 180 will be described in further detail later.

Figure 2:
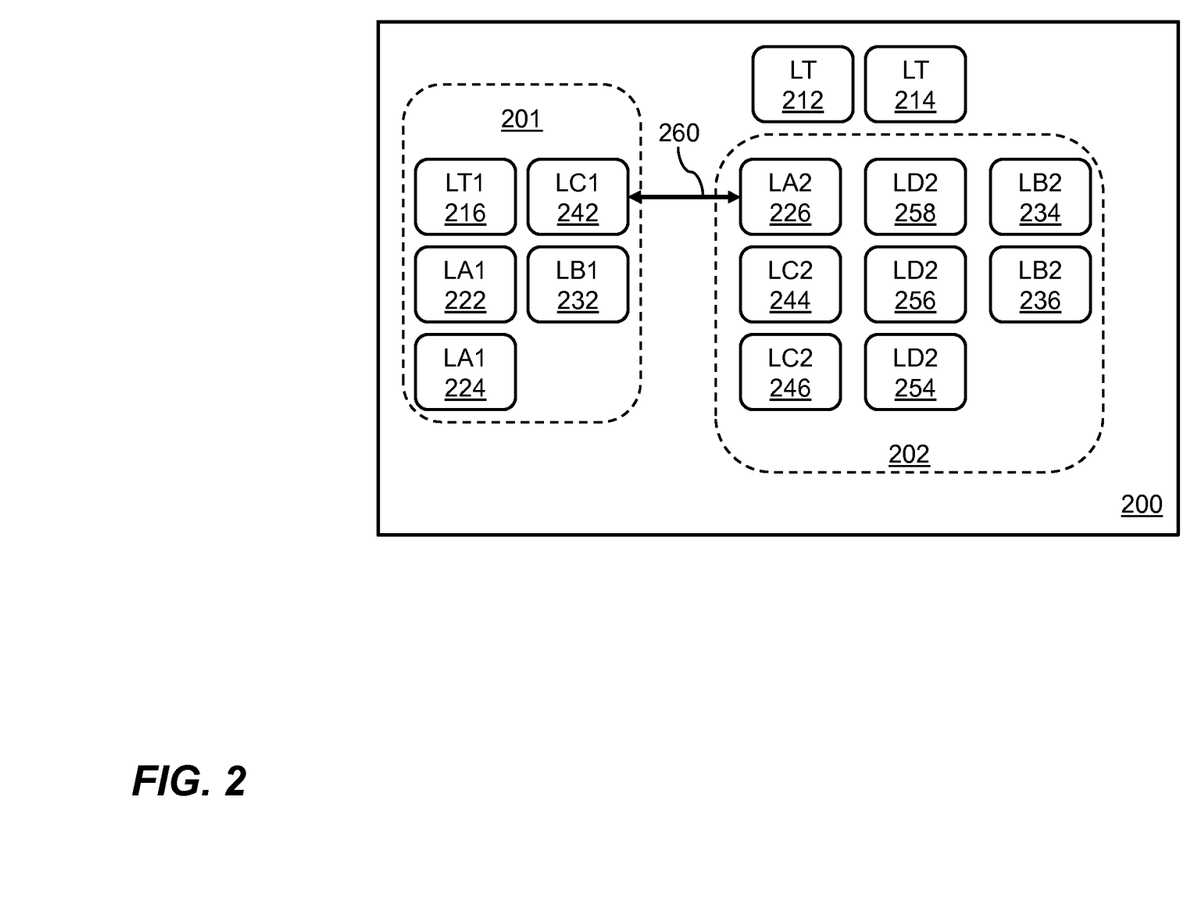
FIG. 2 is a diagram showing a chip design with physical partitions.

FIG. 2 is a diagram showing a chip design with physical partitions. The example chip design 200 corresponds to the design shown in FIG. 1 with the same leaf cells and the two physical partitions. A first physical partition 201 is shown along with a second physical partition 202. The physical partitions indicate geographical areas within a chip. In a given chip design there may be tens, hundreds, or even thousands of physical partitions. Within the chip design 200 are two top level leaf cells "LT" 212 and "LT" 214. Within the first physical partition 201 are leaf cells "LT1" 216, "LA1" 222, "LA1" 224, "LC1" 242, and "LB1" 232. Within the second physical partition 202 are leaf cells "LA2" 226, "LB2" 234, "LB2" 236, "LC2" 244, "LC2" 246, "LD2" 254, "LD2" 256, and "LD2" 258. Physical partitioning is used in the chip design effort so that a contiguous geographical region can be optimized on its own. By considering a single physical partition, design software can handle the number of gates within that physical partition and make the design problem tractable. The design effort may include optimization from a timing, power, space, noise, or other perspective considered when designing on-chip logic and circuitry. An example wire 260 is shown connecting leaf cells "LC1" 242 and "LA2" 226, which corresponds to the net 160 shown within the logically hierarchical design 100 and the net 1060 shown with the physically partitioned design 1000.

Figure 3:
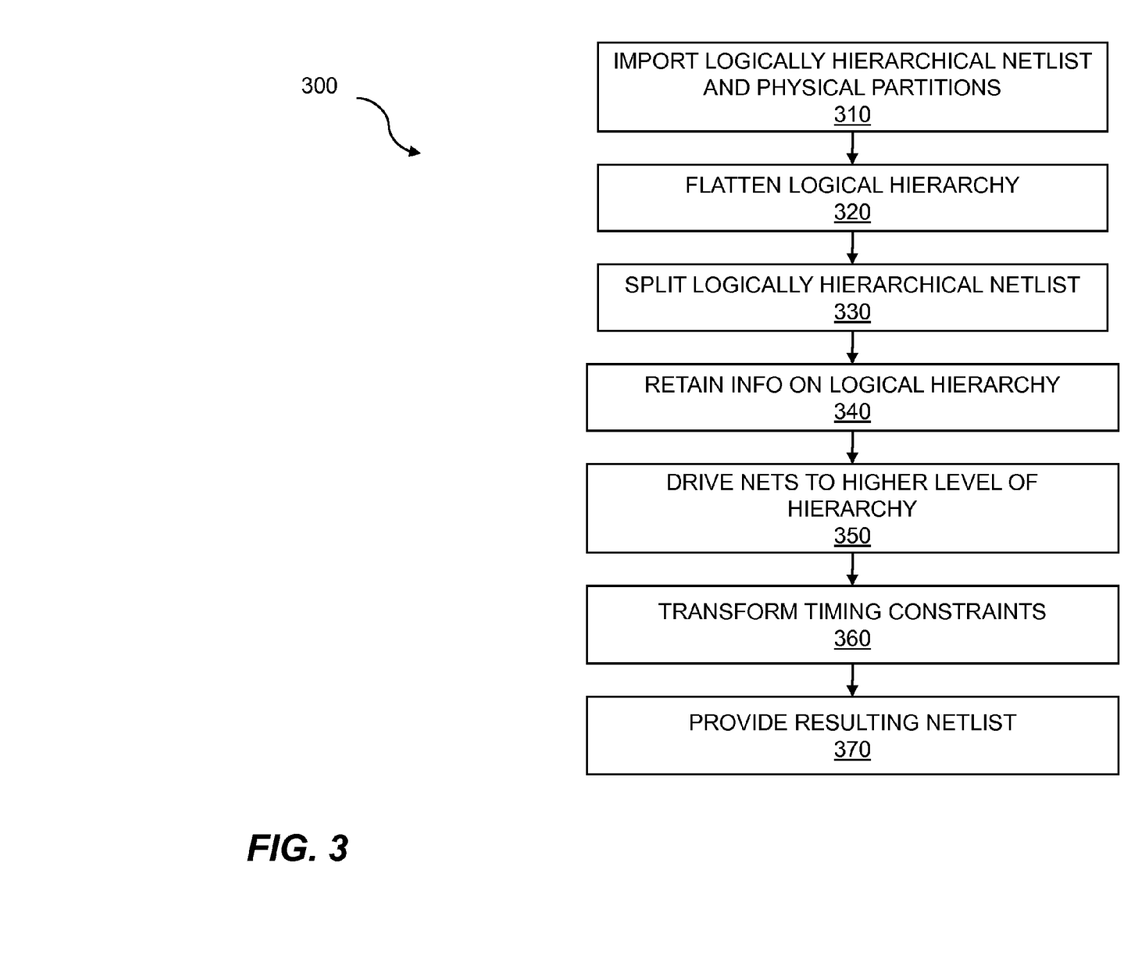
FIG. 3 is a flow diagram of the splitting process.

FIG. 3 is a flow diagram of the splitting process which is a computer implemented method for circuit design. The flow 300 is a method which may be implemented to accomplish the splitting 170 shown in FIG. 1. The flow 300 may begin with importing a logically hierarchical netlist and physical partitions 310. The logically hierarchical netlist may be imported from a database or may be generated as part of the design process, in which case the logically hierarchical netlist would still be residing within the software tool. The logically hierarchical netlist may include a top level model and various sub-models and leaf cells along with interconnection nets to accomplish the desired function on a semiconductor chip or portion of a semiconductor chip. The logically hierarchical netlist may be in Verilog, VHDL, or other hardware description language. The physical partitions may be imported from a database or may be generated as part of the design process, in which case the physical partitions would still be residing within the software tool. The physical partitions may be generated automatically during the design process or may be manually determined by a designer or other user. The physical partitions may be described using GDSII, LEF, DEF, SDF, SPEF, or various other layout description languages. The physical partitions may include the leaf cells, interconnection wires, and other physical portions of the semiconductor chip design. The flow 300 may continue by flattening the logical hierarchy 320. A logically hierarchical netlist may be flattened so that the various models and sub-models under the top level of hierarchy are removed. A logically flat netlist may be a large netlist, e.g. Verilog, which includes all of the logical function. In some cases unique identifiers will be attached to leaf cell names so that individual cells do not have duplicate names with other cells. The point at which flattening occurs within this flow may vary. In some embodiments the splitting process may be accomplished without performing a step of flattening the logical hierarchy.

The flow 300 continues with splitting the logically hierarchical netlist 330. The logically hierarchical netlist may be split according to the physical partitions and physical partition information which existed in the design tool or which was imported. A new netlist will result which reflects the function of the logically hierarchical netlist but which includes portions in the netlist that are attributable to given layout sections. The splitting may include providing overlay cells, copying the models for each of the physical partitions, pushing nets to high levels of hierarchy to continue to maintain connectivity between models in the various physical partitions, and assigning nets and wires in the various physical partitions. The splitting may accommodate multiple voltage domains while preserving logical connections between leaf cells. A logically hierarchical netlist may be split so that an overlay cell may be provided for each portion of a design with a specific voltage. The logically hierarchical netlist may be split so that small portions with a specific voltage are included in an overlay cell. In embodiments, a placement region for the multiple voltage domains may be apportioned into a set of equivalent sub-regions wherein each sub-region belongs to one of the multiple voltage domains. Each of these sub-regions may be split into a separate overlay cell. The set of equivalent sub-regions may comprise the placement region originally used for the multiple voltage domains. The sub-regions may combine to be the same area as the placement region.

In embodiments, the placement of leaf cells is maintained after the splitting. More detail about the splitting process is included in FIG. 4. The flow 300 continues with retaining information on the logical hierarchy 340, within the physical partitions, in the netlist which was split. The information on each model which is retained may include the place in the logical hierarchy for the model originally in the design, the place in the logical hierarchy for the model prior to the splitting, the interconnections for the model, the physical partition information, and other aspects of the design. The information may be attached to the model in the new netlist. The information may be included as metadata relating the models. The retaining of information on the logical hierarchy may be accomplished by performing a force maintain operation. In embodiments, the retaining of information, from the logically hierarchical netlist which was imported, is included in the resulting netlist for each of the physical partitions, after the splitting.

The flow 300 may continue with driving nets to higher levels of hierarchy 350 in order to maintain connection between various models which are part of different physical partitions. The process may include the driving of nets that cross physical partition boundaries to a higher level of hierarchy and thereby maintaining electrical connections for nets to match that of the logically hierarchical netlist which was imported. For example, when two leaf cells are in one logically hierarchical model but in two separate physical partitions, the two leaf cells can be split into the separate physical partitions. Then, in order to maintain connection between these two leaf cells, the connecting net or nets need to traverse up through the hierarchy until a connection can be accomplished.

In some embodiments, the flow 300 continues with transforming timing constraints 360 to maintain timing in the netlist after splitting. The splitting may further comprise transforming timing constraints for the logically hierarchical netlist so that timing requirements are maintained with the resulting netlist. In embodiments, timing constraints are translated to the leaf cell level. The timing constraints may be transformed by a software timer tool. In some embodiments, the transforming of the timing constraints may occur prior to the splitting of the logically hierarchical netlist 330. The flow 300 may continue with providing a resulting netlist 370 with nets which were driven to the higher level of hierarchy. The netlist may be maintained in computer memory or may be output. The netlist can then be used for further design efforts, such as various types of optimization as needed.

Figure 4:
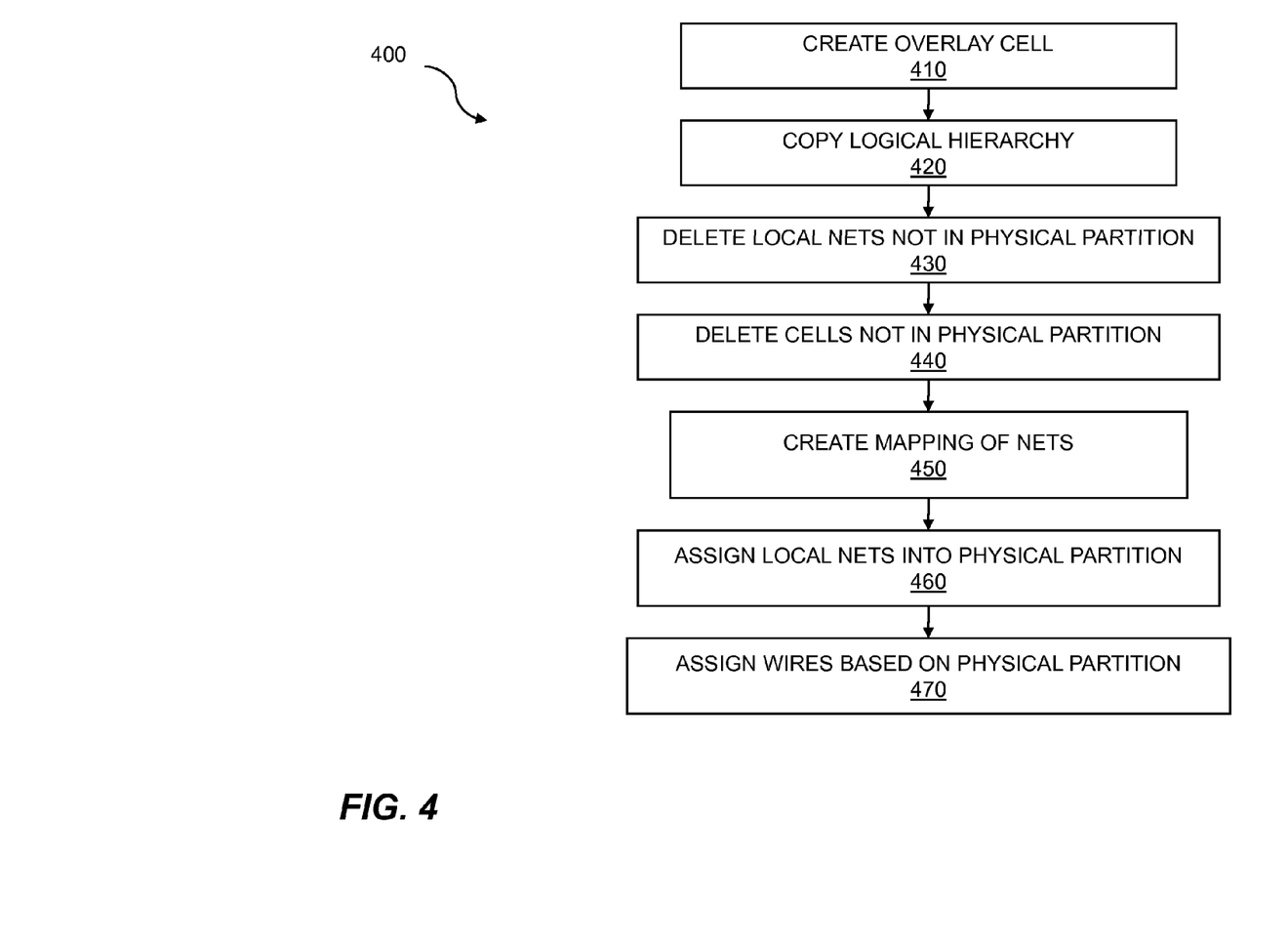
FIG. 4 is a flow diagram of splitting process detail.

FIG. 4 is a flow diagram of splitting process detail. The flow 400 begins with creating overlay cells 410 which correspond to the physical partitions. In embodiments, the creating of an overlay cell can be instantiated at a lowest common hierarchical ancestor (LCA) of one of the physical partitions. An LCA may be a lowest level model in a netlist hierarchy in which all models and leaf cells, within the given physical partition, reside. An overlay cell may be created at a level of hierarchy within one of the physical partitions that contains leaf cells and copies of the models which have the leaf cells and sub models instantiated within the overlay cells. The overlay cells are instantiated within the hierarchy and allow the logical function to be maintained along with the electrical connectivity. The overlay cell may be created at the lowest common hierarchical model, also known as an ancestor, within one of the physical partitions. The lowest common hierarchical model will be able to contain all of the sub models and leaf cells within a physical partition. The flow 400 continues with copying the logical hierarchy 420 within the physical partition. The copying of the logical hierarchy puts a copy inside the overlay cell. Copying includes each of the leaf cells, sub models, and nets wholly contained within the physical partition. In embodiments, the copying includes all cells and nets from logical hierarchy under the LCA. The flow 400 may continue with deleting any of the local nets not within the physical partition 430 which has the overlay cell. These nets could be between cells and leaf cells which are part of a different physical partition or part of the top level model. In embodiments, the process includes deleting all local nets that are not part of the one of the physical partitions. The flow 400 may continue with deleting any of the cells not in the physical partition 440 which has the overlay cell. These cells may be part of a different physical partition or part of the top level model. In embodiments, the deleting includes all cells that are not part of the one of the physical partitions.

The flow 400 may continue with creating a mapping of nets 450 within the overlay cell. The mapping includes information on the logical hierarchy so that merging can be accomplished which restores the logical hierarchy to comparable or original states. In embodiments, the creating includes a mapping of nets in the logical hierarchy and the physical partitions. Information on the wires within the physical partitions may be included. The mapping may include creating an index table describing the logically hierarchical netlist. In embodiments, the mapping includes populating the index table with information from the logically hierarchical netlist which was imported. The flow 400 may continue with assigning local nets into the physical partition 460. In embodiments, the effort includes assigning all local nets into the one of the physical partitions. The flow 400 may continue with assigning wires based on the physical partition 470. In embodiments, this effort includes assigning wires under the one of the physical partitions based on physical overlap in the physical partitions.

Figure 5:
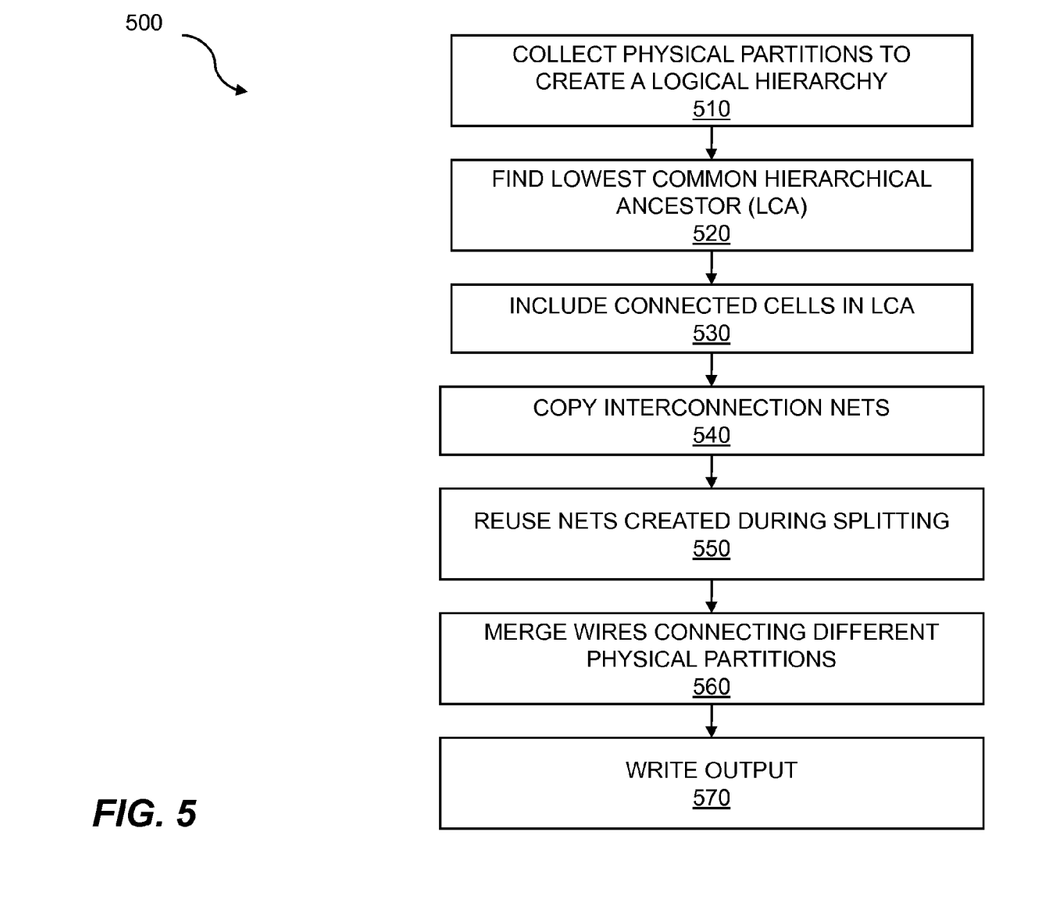
FIG. 5 is a flow diagram of the merging process.

FIG. 5 is a flow diagram of the merging process. In many ways the merging process can be considered to be a reversal of the splitting process. A flow 500 begins with the collecting of physical partitions to create a logical hierarchy 510. A hierarchical netlist may be generated which includes the physical partitions. In embodiments, multiple physical partitions may be selected from a semiconductor chip design and combined. In some embodiments, all physical partitions on a semiconductor chip or portions thereof may be combined. A top level model instantiating the multiple physical partitions may be assembled. The various sub models, leaf cells, and nets may be included in the logical hierarchy. In some embodiments, the merging of the physical partitions may create a logical hierarchy. In embodiments, the logical hierarchy which was created is an equivalent to that of the logically hierarchical netlist that was imported. In some embodiments, the logical hierarchy which was created is identical to that of the logically hierarchical netlist which was imported. The flow 500 continues with finding the lowest common hierarchical ancestor (LCA) 520. The LCA may be found by identifying an overlay cell and then determining the parent model within which the overlay cell is instantiated. The LCA may also be determined from the splitting which previously occurred. There may be a net which communicates beyond the LCA to cells and models not being part of the physical partitions but these may be handled by providing interconnect nets and ports where needed. In embodiments, the process includes finding a lowest common hierarchical ancestor model of connected cells, based on the logically hierarchical netlist which was imported. The flow 500 continues with including connected cells in the LCA 530. All cells with connections only to other cells within the physical partitions being combined in the LCA may be included. In embodiments, the process includes the connected cells in the lowest common hierarchical ancestor model.

The flow 500 continues with copying interconnection nets 540 under the LCA. All of the nets which interconnect cells and models wholly contained within the physical partitions from the LCA may be included. In embodiments, the process includes copying nets which interconnect the connected cells. The flow 500 may continue with reusing nets created during splitting 550. When nets were created as part of the splitting process, these nets may be reused in the LCA. In embodiments, the process includes reusing nets created by the splitting to stitch interface connections. The flow 500 continues with merging wires connecting different physical partitions 560. The wires which connect to physical partitions not included in the LCA may be included with appropriate nets and ports being included where needed to maintain electrical connectivity. In embodiments, the process includes merging nets which connect different physical partitions. The flow 500 may continue with writing an output 570. In embodiments, the output is in a format from a group comprising Verilog, SDF, SPEF, and DEF. In some embodiments of flow 500 the resulting merged design may simply be used in the next stage of the semiconductor design process and therefore not require any output to be written.

Figure 6:
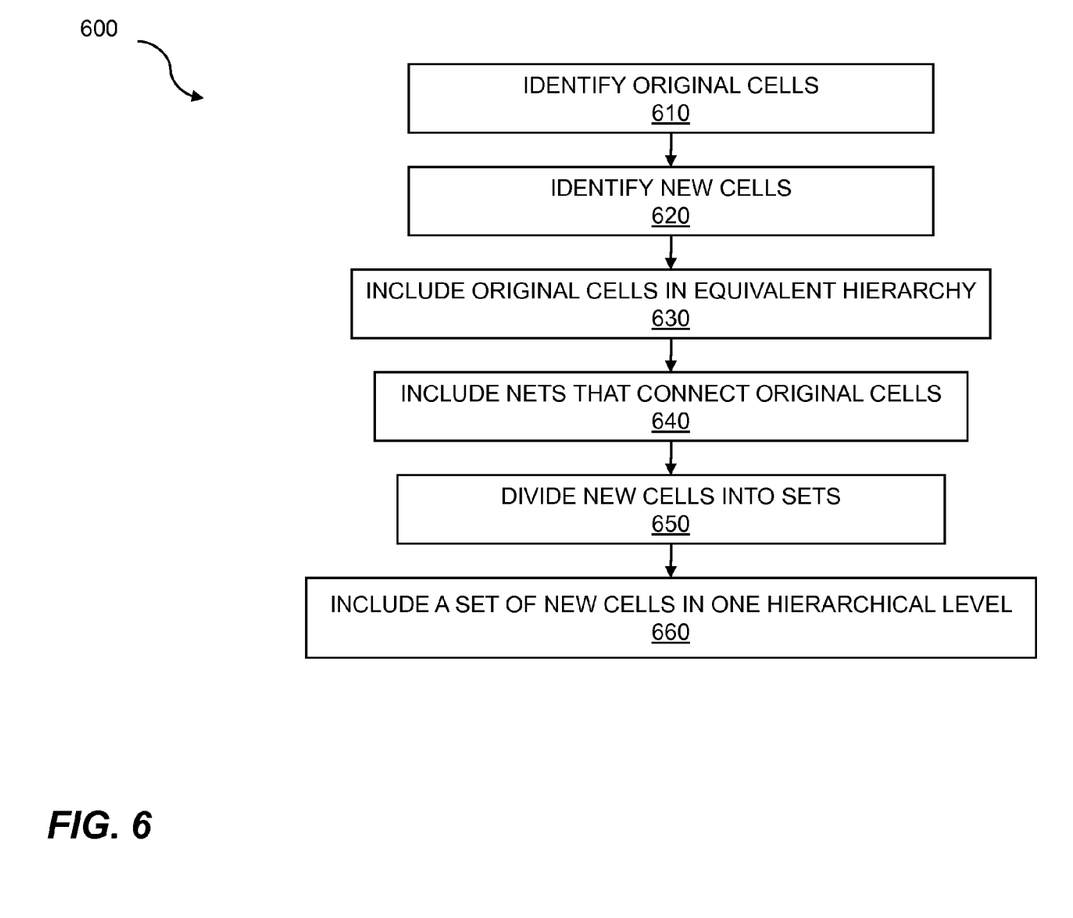
FIG. 6 is a flow diagram of the merging process details with new cells.

FIG. 6 is a flow diagram of the merging process details with new cells. The flow 600 shows how new cells are handled during the merging. New cells can be created during various steps in the design process. For example, timing optimization may require duplicating cells or adding buffers in order to meet timing requirements. Cloning of cells will also create new cells. Likewise buffering or other optimizations may result in the creation of new cells. If new cells have been created since the last splitting the new cells must be handled within the logically hierarchical netlist which is created during the merging. A cell created since a previous splitting operation may inherit an index reference from the parent model in which the new cell is instantiated. The flow 600 begins with identifying original cells 610 in the design. The original cells may have been tagged before any splitting to label them as original cells and where in the hierarchy the cells resided. In embodiments, the process includes identifying original cells within a physical partition which were present at the splitting which occurred last. The flow 600 continues with identifying new cells 620. In embodiments, the process includes the identifying of new cells within the physical partition which have been added since the splitting which occurred last. The flow 600 continues with including original cells in the equivalent hierarchy 630. When the original cells from the design are included in the equivalent hierarchy, the resulting merged design may be close to or even identical with the original logically hierarchical netlist. In embodiments, the process executes to include the original cells which were identified in hierarchical levels equivalent to those where the original cells belonged before the splitting. The flow may continue by including nets that connect the original cells 640. The nets which connected the original cells may have been labeled as such prior to the splitting. In embodiments, the process includes nets which connect the original cells within the physical partition. The flow 600 may continue with dividing new cells into sets 650. The new cells, once identified, may be grouped so that all the cells of a set only connect to original cells and the new cells within the set. Further, each set may have new cells all having a common parent model. In embodiments, the new cells, which were identified, are divided into a plurality of sets wherein the new cells within one set are only connected to original cells and the new cells within the one set. The flow 600 continues with including a set of the new cells within one hierarchical level. In embodiments, the process includes the new cells in the one set in a single hierarchical level 660. In some embodiments, the single hierarchical level may be a highest level of hierarchy for an original cell which is connected to a cell from the new cells in the one set.

Figure 7:
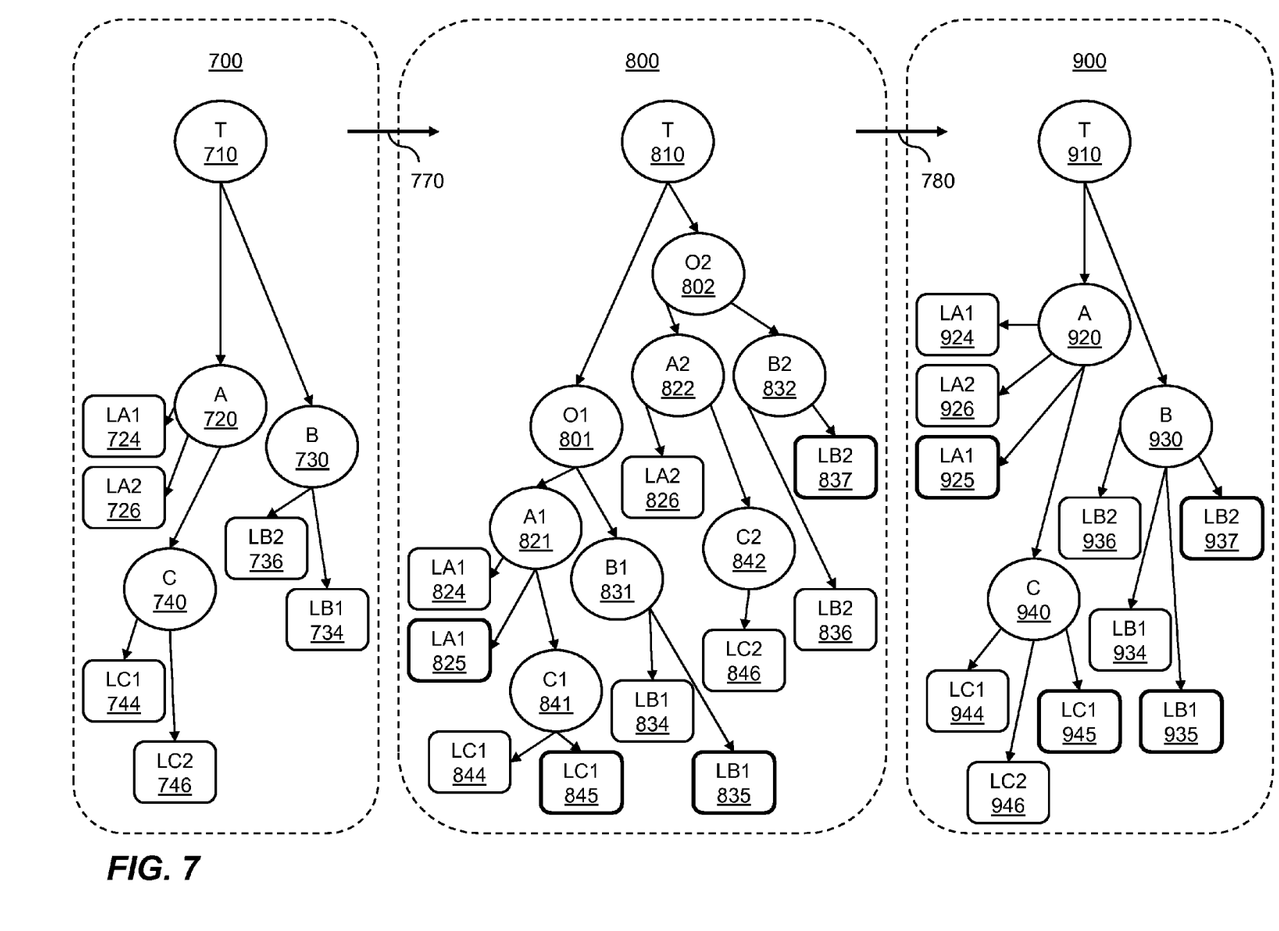
FIG. 7 is an exemplary diagram showing the merging of new cells.

FIG. 7 is an exemplary diagram showing the merging of new cells. An original example design 700 is shown with a top level model "T" 710. Within the top level model "T" 710 is instantiated two models "A" 720 and "B" 730. Model "A" 720 has leaf cells "LA1" 724 and "LA2" 726 as well has model "C" 740. Within model "C" 740 is instantiated leaf cells "LC1" 744 and "LC2" 746. Within model "B" 730 is instantiated leaf cells "LB1" 734 and "LB2" 736. In each case a concatenation of a "1" indicates a leaf cell which is in a first physical partition while a concatenation of a "2" indicates that the leaf cell is in the second physical partition.

When design 700 is split 770 the design 800 results. A top level model "T" 810 includes overlay cells "O1" 801 and "O2" 802. Within overlay cell "O1" are instantiated copies of models "A" and "B" being "A1" 821 and "B1" 831, respectively. Within "A1" are instantiated "LA1" 824 and "C1" 841. During the design process a new cell "LA1" 825 was created. Within model "C1" is instantiated leaf cell "LC1" 844. During the design process a new cell "LC1" 845 was created. Within model "B1" 831 is instantiated leaf cell "LB1" 834. During the design process a new cell "LB1" 835 was created.

Within overlay cell "O2" is instantiated models "A2" 822 and "B2" 832. Within model "A2" 822 is instantiated "LA2" 826 and "C2" 842. Within model "C2" is instantiated "LC2" 846. Within model "B2" is instantiated leaf cell "LB2" 836. During the design process a new cell "LB2" 837 was created.

When design 800 is merged 780 a new logically hierarchical netlist design 900 results. A top level model "T" 910 includes models "A" 920 and "B" 930 just as in the original design 700. Likewise leaf cells "LA1" 924, "LA2" 926, "LC1" 944, "LC2" 946, "LB1" 934, and "LB2" 936 are included as in the original design 700. New cells "LA1" 925, "LC1" 945, "LB1" 935, and "LB2" 937 must be placed within design 900. The new cells are divided into sets where each set is included at one hierarchical level. In this example design, new leaf cell "LA1" 925 is considered one set, "LC1" 945 is considered a second set and new leaf cells "LB1" 935 and "LB2" 937 can be grouped as a third set. Since "LB1" 935 and "LB2" 937 have a common parent of "B" 930, after the merging process, these two leaf cells can be grouped together into a set. In this case the first set can be included within model "A" 920 and instantiated there. The second set can be included within "C" 940 and instantiated there. The third set can be included within "B" 930 and instantiated there.

Figure 8:
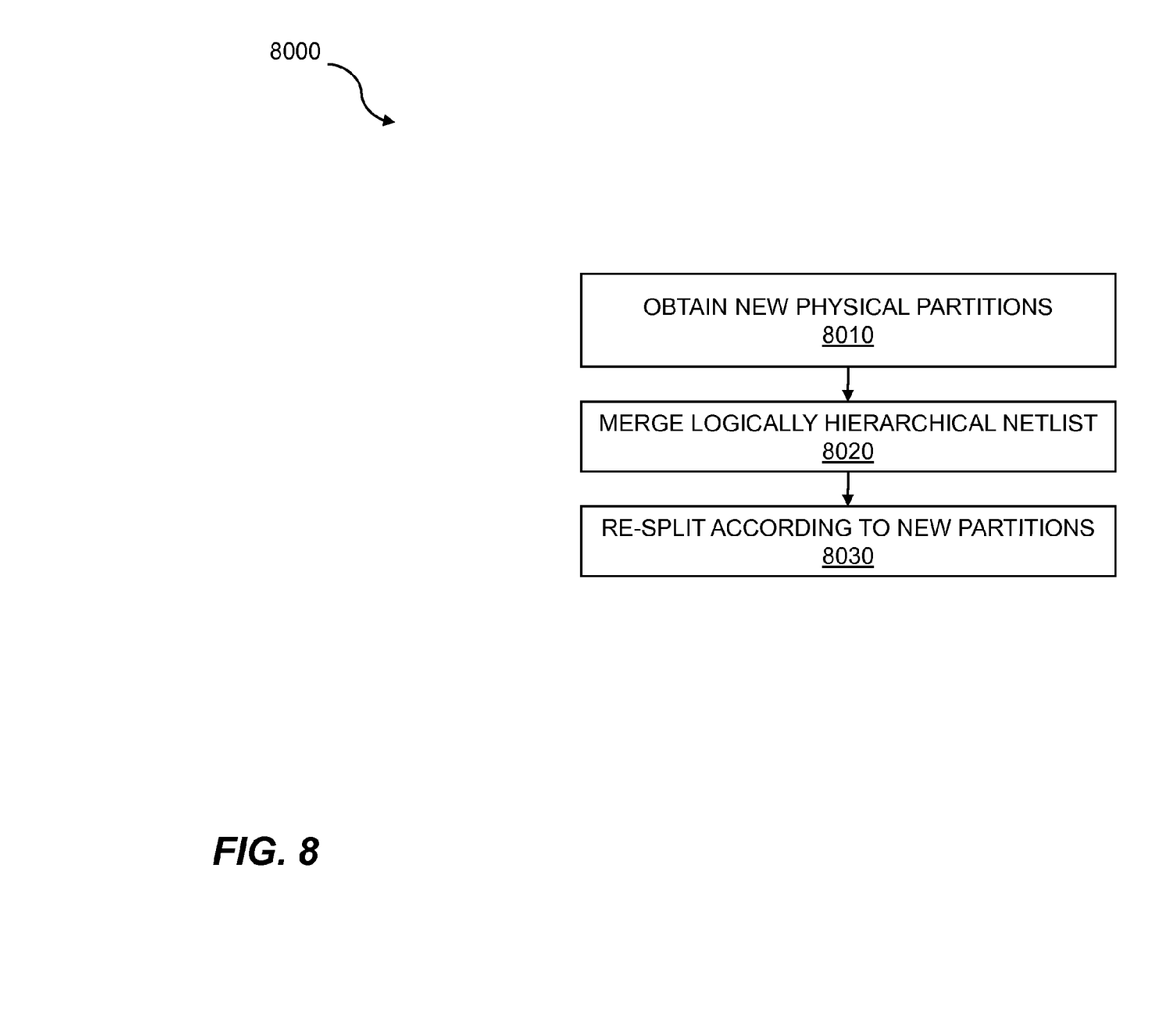
FIG. 8 is a flow diagram for repartitioning.

FIG. 8 is a flow diagram for repartitioning. The flow 8000 is a computer implemented method for circuit design where the physical design or layout has been modified and the logical netlist is desired to reflect the updated physical design. The flow 8000 may start from a design which was partitioned according to the flow 300 for splitting and/or the flow 400 for splitting detail. The flow 8000 begins with obtaining new physical partitions 8010 wherein leaf cells are located differently from the physical partitions which were imported. The new physical partitions may be imported from a database or may be generated as part of the design process, in which case the new physical partitions would still be residing within the software tool. The new physical partitions may be generated automatically during the design process or may be manually determined by a designer or other user. New leaf cells may have been included. Leaf cells may have been cloned, buffering may have been provided, optimization performed, and so on. The new physical partitions may have connections between the leaf cells that have changed from the physical partitions which were imported. The new physical partitions may have a global routing topology of connections that have changed from the physical partitions which were imported. The flow 8000 may continue with merging incrementally the logically hierarchical netlist 8020 which was split to create a re-merged logically hierarchical netlist with the leaf cells which were located differently. The merging process may include steps from the flow 500 for the merging process. The merging may be for a portion of the design where changes were made to the layout. The flow 8000 may include re-splitting incrementally the re-merged logically hierarchical netlist according to the new physical partitions 8030. The splitting process may include steps from the flow 300 for splitting and/or the flow 400 for splitting detail. The resulting netlist which has been re-split may be maintained in computer memory or may be output. The netlist can then be used for further design efforts, such as various types of optimization as needed. The process of repartitioning may be repeated as needed throughout the design process and whenever layout or physical changes are implemented in the semiconductor design.

Figure 9:
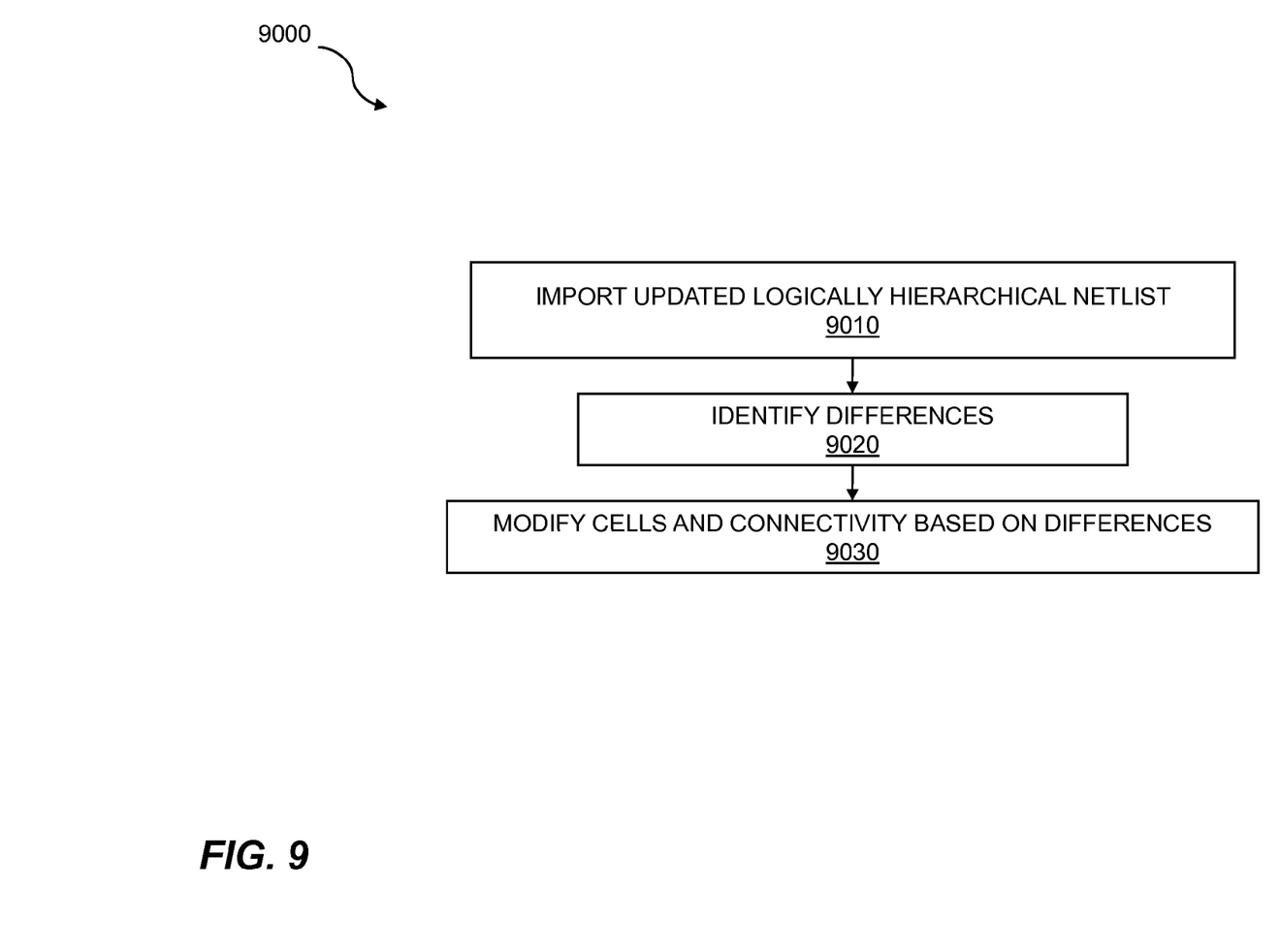
FIG. 9 is a flow diagram for handling design changes.

FIG. 9 is a flow diagram for handling design changes. The flow 9000 is a computer implemented method for circuit design where the logical design has been modified and the changes need to be implemented in the physical design. The flow 9000 may start from a design which was partitioned according to the flow 300 for splitting and/or the flow 400 for splitting detail. The flow 9000 begins with importing an updated logical hierarchical netlist 9010. The updated logically hierarchical netlist may be imported from a database or may be generated as part of the design process, in which case the updated logically hierarchical netlist would still be residing within the software tool. The logically hierarchical netlist may have been updated due to changes in the logic design, changes in the performance, specification requirement changes, and so on. The flow 9000 may continue with identifying differences 9020 between the logically hierarchical netlist which was originally imported and the updated logically hierarchical netlist. A compare may be performed on a portion or all of the original logically hierarchical netlist which was imported. The compare may be performed by a design automation tool, a "diff" function within an operating system, and so on. The flow 9000 may continue with modifying a plurality of leaf cells and connectivity within the physical partitions based on the differences 9030 which were identified. One or more leaf cells may be changed. Connections between the leaf cells may be changed. Connections between the physical partitions may be changed. The modifying may include adding one or more new leaf cells, deleting one or more leaf cells, or modifying a connection between leaf cells.

Figure 10:
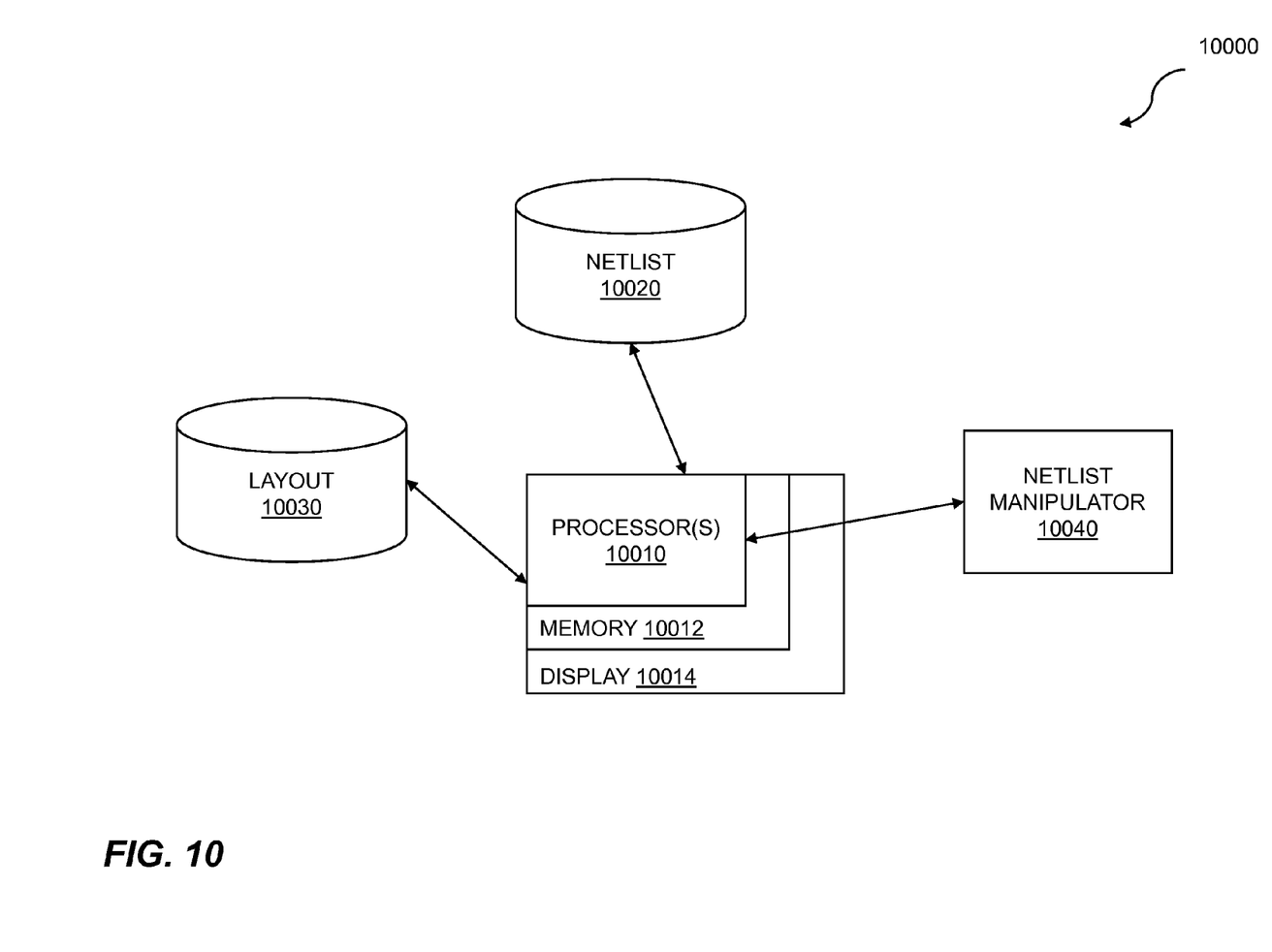
FIG. 10 is a system diagram for netlist manipulation.

FIG. 10 is a system diagram 10000 for netlist manipulation. Netlist manipulation may be performed by one or more processors 10010. The processors 10010 may execute instructions stored in one or more memories 10012. The memories 10012 may be used for storing instructions, for temporary data storage, for system support, for storing netlists, for storing layout, and the like. Netlists, layouts, schematics, and the like may be shown in a display 10014 that is attached to the processors 10010. The processors 10010 may read in or import a semiconductor netlist 10020. The processors 10010 may read in or import a semiconductor layout 10030. A netlist manipulator 10040 may perform netlist manipulation on the netlist 10020. The manipulator 10040 may perform the various steps described earlier in this disclosure. The manipulator 10040 may include the processors 10010 or may be a separate processor which executes code for performing netlist manipulation. In embodiments, the manipulator performs splitting and merging on logically hierarchical netlists. In embodiments, the splitting and merging is based on physical partitions in the layout 10030.

Each of the above methods may be executed on one or more processors on one or more computer systems. Embodiments may include various forms of distributed computing, client/server computing, and cloud based computing. Further, it will be understood that for each flow chart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which implementations may be generally referred to herein as a "circuit," "module," or "system."

A programmable apparatus which executes any of the above mentioned computer program products or computer implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM, Flash, MRAM, FeRAM, or phase change memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A computer implemented method for circuit design comprising:
   importing a logically hierarchical netlist and physical partitions;
   splitting the logically hierarchical netlist according to the physical partitions;
   retaining information on logical hierarchy within the physical partitions;
   driving nets, using one or more processors, that cross physical partition boundaries to a higher level of hierarchy and maintaining electrical connections for nets to match that of the logically hierarchical netlist which was imported; and
   providing a resulting netlist with nets which were driven to the higher level of hierarchy.

2. The method of claim 1 further comprising:
   obtaining new physical partitions wherein leaf cells are located differently from the physical partitions which were imported;
   merging incrementally the logically hierarchical netlist which was split to create a re-merged logically hierarchical netlist with the leaf cells which were located differently; and
   re-splitting incrementally the re-merged logically hierarchical netlist according to the new physical partitions.

3. The method of claim 2 wherein the new physical partitions have connections between the leaf cells that have changed and wherein global routing topology of connections has changed, from the physical partitions which were imported.

4. The method of claim 1 further comprising:
   importing an updated logically hierarchical netlist;
   identifying differences between the logically hierarchical netlist which was originally imported and the updated logically hierarchical netlist; and
   modifying a plurality of leaf cells and connectivity within the physical partitions based on the differences which were identified.

5. The method of claim 4 wherein the modifying includes one of adding one or more new leaf cells, deleting one or more leaf cells, and modifying a connection between leaf cells.

6. The method of claim 1 wherein the splitting accommodates multiple voltage domains while preserving logical connections between leaf cells.

7. The method of claim 6 wherein a placement region for the multiple voltage domains are apportioned into a set of equivalent sub-regions wherein each sub-region belongs to one of the multiple voltage domains.

8. The method of claim 7 wherein the set of equivalent sub-regions comprise the placement region originally used.

9. The method according to claim 1 further comprising retaining information, from the logically hierarchical netlist which was imported, in the resulting netlist for each of the physical partitions, after the splitting.

10. The method according to claim 1 further comprising flattening the logical hierarchy.

11. The method according to claim 1 wherein the splitting further comprises: creating an overlay cell at a lowest common hierarchical ancestor of one of the physical partitions; copying all cells and nets from logical hierarchy under the lowest common hierarchical ancestor; deleting all local nets that are not part of the one of the physical partitions; deleting all cells that are not part of the one of the physical partitions; creating a mapping of nets in the logical hierarchy and the physical partitions; assigning all local nets into the one of the physical partitions; and assigning wires under the one of the physical partitions based on physical overlap in the physical partitions.

12. The method according to claim 1 wherein the splitting further comprises transforming timing constraints for the logically hierarchical netlist so that timing requirements are maintained with the resulting netlist.

13. The method according to claim 1 further comprising creating an index table describing the logically hierarchical netlist.

14. The method according to claim 13 further comprising populating the index table with information from the logically hierarchical netlist which was imported.

15. The method according to claim 1 further comprising merging the physical partitions to create a logical hierarchy.

16. The method according to claim 15 wherein the merging comprises:
identifying original cells within a physical partition which were present at the splitting which occurred last;
identifying new cells within the physical partition which have been added since the splitting which occurred last;
including the original cells which were identified in hierarchical levels equivalent to those where the original cells belonged before the splitting; and
including nets which connect the original cells within the physical partition.

17. The method according to claim 16 further comprising:
dividing the new cells, which were identified, into a plurality of sets wherein the new cells within one set are only connected to original cells and the new cells within the one set; and
including the new cells in the one set in a single hierarchical level.

18. The method according to claim 15 wherein the logical hierarchy which was created is an equivalent to that of the logically hierarchical netlist that was imported.

19. The method according to claim 15 wherein the merging further comprises: finding a lowest common hierarchical ancestor model of connected cells, based on the logically hierarchical netlist which was imported; including the connected cells in the lowest common hierarchical ancestor model; copying nets which interconnect the connected cells; reusing nets created by the splitting to stitch interface connections; and merging nets which connect different physical partitions.

20. A computer program product embodied in a non-transitory computer readable medium that, when executed, performs steps of:
importing a logically hierarchical netlist and physical partitions;
splitting the logically hierarchical netlist according to the physical partitions;
retaining information on logical hierarchy within the physical partitions;
driving nets that cross physical partition boundaries to a higher level of hierarchy and maintaining electrical connections for nets to match that of the logically hierarchical netlist which was imported; and
providing a resulting netlist with nets which were driven to the higher level of hierarchy.

21. The computer program product of claim 20 that further performs steps of:
obtaining new physical partitions wherein leaf cells are located differently from the physical partitions which were imported;
merging incrementally the logically hierarchical netlist which was split to create a re-merged logically hierarchical netlist with the leaf cells which were located differently; and
re-splitting incrementally the re-merged logically hierarchical netlist according to the new physical partitions.

22. The computer program product of claim 20 that further performs steps of:
importing an updated logically hierarchical netlist;
identifying differences between the logically hierarchical netlist which was originally imported and the updated logically hierarchical netlist; and
modifying a plurality of leaf cells and connectivity within the physical partitions based on the differences which were identified.

23. The computer program product of claim 20 wherein the splitting accommodates multiple voltage domains while preserving logical connections between leaf cells.

24. The computer program product of claim 20 that further performs a step of retaining information, from the logically hierarchical netlist which was imported, in the resulting netlist for each of the physical partitions, after the splitting.

25. The computer program product of claim 20 that further performs a step of merging the physical partitions to create a logical hierarchy.

26. A computer system for circuit design comprising:
a memory for storing instructions;
one or more processors attached to the memory wherein the one or more processors are configured to:
import a logically hierarchical netlist and physical partitions;
split the logically hierarchical netlist according to the physical partitions;
retain information on logical hierarchy within the physical partitions;
drive nets that cross physical partition boundaries to a higher level of hierarchy and maintaining electrical connections for nets to match that of the logically hierarchical netlist which was imported; and
provide a resulting netlist with nets which were driven to the higher level of hierarchy.

27. The system of claim 26 wherein the one or more processors are further configured to:
obtain new physical partitions wherein leaf cells are located differently from the physical partitions which were imported;
merge incrementally the logically hierarchical netlist which was split to create a re-merged logically hierarchical netlist with the leaf cells which were located differently; and
re-split incrementally the re-merged logically hierarchical netlist according to the new physical partitions.

28. The system of claim 26 wherein the one or more processors are further configured to:
import an updated logically hierarchical netlist;
identify differences between the logically hierarchical netlist which was originally imported and the updated logically hierarchical netlist; and
modify a plurality of leaf cells and connectivity within the physical partitions based on the differences which were identified.

29. The system of claim 26 wherein the splitting accommodates multiple voltage domains while preserving logical connections between leaf cells.

30. The system of claim 26 wherein the one or more processors are further configured to retain information, from the logically hierarchical netlist which was imported, in the resulting netlist for each of the physical partitions, after splitting.

31. The system of claim 26 wherein the one or more processors are further configured to merge the physical partitions to create a logical hierarchy.

* * * * *